US009171973B2

(12) United States Patent
Girard Desprolet et al.

(10) Patent No.: US 9,171,973 B2
(45) Date of Patent: Oct. 27, 2015

(54) METHOD FOR PRODUCING AN INTEGRATED IMAGING DEVICE WITH FRONT FACE ILLUMINATION COMPRISING AT LEAST ONE METAL OPTICAL FILTER, AND CORRESPONDING DEVICE

(71) Applicants: STMicroelectronics (Crolles 2) SAS, Crolles (FR); STMicroelectronics SA, Montrouge (FR); Commissariat a l'Energie Atomique et aux Energies Alternatives, Paris (FR)

(72) Inventors: Romain Girard Desprolet, Grenoble (FR); Sandrine Lhostis, Theys (FR); Salim Boutami, Grenoble (FR); Michel Marty, Grenoble (FR)

(73) Assignees: STMicroelectronics (Crolles 2) SAS, Crolles (FR); STMicroelectronics SA, Montrouge (FR); Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/559,006

(22) Filed: Dec. 3, 2014

(65) Prior Publication Data
US 2015/0155319 A1 Jun. 4, 2015

(30) Foreign Application Priority Data

Dec. 4, 2013 (FR) ...................................... 13 62088

(51) Int. Cl.
*H01L 31/0232* (2014.01)
*H01L 31/0216* (2014.01)
(Continued)

(52) U.S. Cl.
CPC .......... *H01L 31/02162* (2013.01); *G02B 5/203* (2013.01); *H01L 27/1463* (2013.01); *H01L 27/14621* (2013.01); *H01L 27/14629* (2013.01); *H01L 27/14685* (2013.01);
(Continued)

(58) Field of Classification Search
CPC .................. H01L 31/02162; H01L 31/02165; H01L 31/02327; H01L 27/14621; G02B 5/203
See application file for complete search history.

(56) References Cited

U.S. PATENT DOCUMENTS 8,334,493 B2 * 12/2012 Yokogawa ................. 250/208.1
2003/0103150 A1   6/2003 Catrysse et al.
(Continued)

FOREIGN PATENT DOCUMENTS

EP          2275790 A2 *   1/2011

OTHER PUBLICATIONS

C. Genet & TW Ebbesen "Light in Tiny Holes"—Nature Publishing Group, vol. 445, Jan. 4, 2007 pp. 39-46.
(Continued)

*Primary Examiner* — Allan R Wilson
(74) *Attorney, Agent, or Firm* — Gardere Wynne Sewell LLP

(57) ABSTRACT

An integrated imaging device supports front face illumination with one or more photosensitive regions formed in a substrate. A lower dielectric region is provided over the substrate, the lower dielectric region having an upper face. A metal optical filter having a metal pattern is provided on the upper face (or extending into the lower dielectric region from the upper face). An upper dielectric region is provided on top of the lower dielectric region and metal optical filter. The lower dielectric region is at least part of a pre-metal dielectric layer, and the upper dielectric region is at least part of a metallization layer.

19 Claims, 3 Drawing Sheets

(51) Int. Cl.
*G02B 5/20* (2006.01)
*H01L 27/146* (2006.01)

(52) U.S. Cl.
CPC ... *H01L 27/14687* (2013.01); *H01L 31/02165* (2013.01); *H01L 31/02327* (2013.01)

(56) References Cited

U.S. PATENT DOCUMENTS

| | | | |
|---|---|---|---|
| 2005/0121599 A1 | 6/2005 | Mouli | |
| 2005/0233493 A1* | 10/2005 | Augusto | 438/51 |
| 2008/0090323 A1* | 4/2008 | Wu | 438/70 |
| 2008/0170143 A1 | 7/2008 | Yoshida | |
| 2009/0008730 A1* | 1/2009 | Roy et al. | 257/432 |
| 2009/0146198 A1 | 6/2009 | Joe et al. | |
| 2009/0315131 A1* | 12/2009 | Hung et al. | 257/432 |
| 2009/0323060 A1 | 12/2009 | Knipp | |
| 2010/0176280 A1* | 7/2010 | Yokogawa | 250/226 |
| 2013/0093034 A1* | 4/2013 | Kokubun et al. | 257/432 |
| 2014/0049812 A1* | 2/2014 | Palanchoke et al. | 359/360 |
| 2014/0146207 A1* | 5/2014 | Yokogawa | 348/281 |
| 2015/0021604 A1* | 1/2015 | Kim et al. | 257/48 |
| 2015/0206912 A1* | 7/2015 | Kanamori et al. | 250/208.1 |

OTHER PUBLICATIONS

Ting Xu, Haofei Shi, Yi Kuei Wu, Alex F. Kaplan "Structural Colors : From Plasmonic to Carbon Nanostructures" Subwavelenght Nanostructures Wiley on Line Library 2011, 7, No. 22, 3128-3136.

* cited by examiner

METHOD FOR PRODUCING AN INTEGRATED IMAGING DEVICE WITH FRONT FACE ILLUMINATION COMPRISING AT LEAST ONE METAL OPTICAL FILTER, AND CORRESPONDING DEVICE

PRIORITY CLAIM

This application claims priority from French Application for Patent No. 1362088 filed Dec. 4, 2013, the disclosure of which is incorporated by reference.

TECHNICAL FIELD

Embodiments of the invention relate to integrated imaging devices with front face illumination, and in particular, integrated imaging devices comprising metal optical filters designed to filter, in other words to allow through, various types of light radiation within a desired wavelength range, in particular in the visible, UV or infrared range.

BACKGROUND

Imaging devices with front face illumination generally comprise a set of pixels each having a photosensitive semiconductor region disposed under an integrated optical filter. Groups of pixels with red, green and blue filters may notably be used, in such a manner as to form Bayer patterns well known to those skilled in the art.

Optical filters designed to only let through a single color generally comprise an organic filter colored by pigments allowing infrared to pass. It is generally advisable to combine them with an additional infrared filter for imaging applications in the visible range.

Colored filters also have the drawback of not being sufficiently robust, and of not being able to be used for the infrared wavelengths.

Furthermore, a multicolor imager requires a number of photolithographic steps proportional to the number of types of colored filters to be formed. These filters also have the drawback of being degraded when they are exposed to temperatures in excess of 200° C.

On the other hand, interference filters (known as multilayer filters) also allow image sensors to be formed without being limited to the visible wavelengths, and they can therefore be used for applications outside of the visible range (UV or infrared). Their multilayer structure however makes them expensive and more difficult to integrate owing to the large number of deposition steps needed for their fabrication and to the total thickness of the stack, which can be greater than one micron.

Alternatives to colored filters using pigments and to multilayer filters have therefore been provided.

Optical filters are known from the prior art comprising one or more metal layers in which patterns (holes or bumps) are formed having dimensions of the order of ten to a hundred nanometers. This type of structure is better known by the term plasmonic filter.

For this purpose, reference may be made to the document "Light in tiny holes" (C. Genet and T. W. Ebbesen, Nature 445, pages 39-46, 4 Jan. 2007, the disclosure of which is incorporated by reference) which describes the transmission of light by nanometer-sized holes.

Reference may also be made to the document "Structural Colors: From Plasmonic to Carbon Nanostructures" (Ting Xu et al, Small Volume 7, Issue 22, pages 3128-3136, Nov. 18, 2011, the disclosure of which is incorporated by reference) which describes filters comprising nanometer-sized metal patterns for filtering various colors, notably with periodic patterns.

Finally, reference may be made to the document United States Patent Application Publication No 2003/0103150 (the disclosure of which is incorporated by reference) which discloses metal filters of the type presented hereinbefore which are formed by the same fabrication steps as the tracks of the metallization levels of the integrated circuits comprising these filters. The filters described in this document therefore have the same thickness as the metallization levels, and they comprise the same metal material as the tracks of the metallization levels.

The metal filters obtained in the latter document may not be suitable for filtering the light in a satisfactory manner. Indeed, the metal tracks of metallization levels have a height which can be of the order of several hundreds of nanometers or of the order of a micrometer, and the formation of patterns is limited by the constraints of photolithography and of filling with metal (notably when methods known as "Damascene" are applied). Thus, the solution of the document US 2003/0103150 does not allow the dimensions of the patterns that will form filters to be precisely chosen.

Generally speaking, the metal elements of metallization levels are formed between layers of silicon nitride (SIN) or of silicon carbo-nitride (SICN). These layers of silicon nitride or of silicon carbo-nitride therefore end up, in the solution presented in the document US 2003/0103150, on either side of the metal filters, a fact which is detrimental to the optical properties of the metal filters.

SUMMARY

According to one embodiment and its implementation, the formation is provided of metal optical filters that are more easily configurable, notably with regard to the dimensions, according to the desired application, and which exhibit better optical properties.

According to one aspect, a method for fabricating an integrated imaging device with front face illumination is provided that comprises at least a first photosensitive region in a substrate, the method comprising: the formation of at least a first lower dielectric region on top of the front face of the substrate and of the first photosensitive region, the first lower dielectric region having an upper face, the formation of at least a first metal optical filter comprising a metal pattern on top of the first photosensitive region of a pixel, the said filter being on the said upper face or extending into the first lower dielectric region from the said upper face, and the formation of a first upper dielectric region on top of the first lower dielectric region and of the first metal optical filter so as to form with at least a part of the first lower region a first dielectric region associated with one metallization level of the integrated imaging device, the said upper face of the first lower dielectric region being contained within the said first dielectric region.

It is possible to form the first metal filter at any level chosen by those skilled in the art depending on the application. The term 'level' is here understood to mean a horizontal plane on top of the front face of a substrate. By way of example, the first lower dielectric region can comprise a portion of a region of pre-metal dielectric (or PMD), the first dielectric region then corresponding to a region of pre-metal dielectric, the first metal filter being buried in the region of pre-metal dielectric. This configuration allows the metal optical filter to be placed as close as possible to the substrate, which has the advantage of reducing the problems associated with the phenomenon well known to those skilled in the art by the expression "cross-talk".

Alternatively, it is possible to form a first metal optical filter at a higher level, for example in a region of inter-metal dielectric (or IMD). The first lower dielectric region then comprises the region of pre-metal dielectric, and either a portion of a region of inter-metal dielectric, or one or more regions of inter-metal dielectric and a portion of a region of inter-metal dielectric, and the first dielectric region associated with a metallization level comprises this portion of region of inter-metal dielectric and another portion of inter-metal dielectric (the first upper dielectric region).

It may be noted that the upper face of the first lower dielectric region is always contained in a plane distinct from that from which a metallization level is formed associated with the first dielectric region. It may also be noted that it is possible to form a metal optical filter by forming cavities within the first lower dielectric region and by filling these cavities with metal, or by forming a layer of metal on the first lower dielectric region and by implementing a photolithography step.

It is therefore possible to form metal optical filters having very different heights from those of the metallization levels, which notably allows metal patterns to be formed with minimum lateral dimensions different from the minimum lateral dimensions associated with the steps for fabrication of the metallization levels.

The dimensions of the metal optical filters may thus be more easily adapted to the desired application.

It will be noted that it is not necessary to form layers of silicon nitride or of silicon carbo-nitride on either side of the metal optical filters, and an improvement in the optical properties of the filters is therefore obtained.

The method can furthermore comprise the formation of a second metal optical filter on top of a second photosensitive region distinct from the first photosensitive region.

The first metal optical filter can be formed with a first metal, the second metal optical filter can be formed with a second metal, different from the first metal, the upper face of the first lower dielectric region associated with the first metal optical filter being contained in a plane distinct from the plane containing the upper face of a second lower dielectric region associated with the second metal optical filter. The metals chosen for the two filters are independent of the metals used for the interconnect tracks.

Dimensions and a metal adapted to the filtering of one wavelength can thus be chosen for each optical filter, each filter being formed at a level having a height different from the planes starting from which metallization levels are formed.

For adjacent photosensitive regions, it is possible to form the two filters at a low level of the integrated imaging device in order to limit the 'cross-talk' phenomena.

It may be noted that it is because the upper faces of the lower dielectric regions of the two filters are not contained in the same plane that it is possible to use different metals for these two filters.

The upper face of the first lower dielectric region and the upper face of the second lower dielectric region can be contained within the same dielectric region associated with the same metallization level.

Filters having different characteristics can thus be formed within a very thin layer, preferably both close to the substrate.

The first metal can be of the copper and the second metal can be aluminum.

The inventors have observed that, for the filtering of certain colors, a better transmission of the wavelength to be allowed through, and a better rejection of the other wavelengths with a well chosen metal are obtained. In particular, copper is well adapted for allowing the color red or the near-infrared range through, and aluminum for the color green and the color blue.

As indicated hereinbefore, it is because the upper faces of the lower dielectric regions are contained in separate plans that it is possible to use different metals.

At least four metal optical filters may thus be formed in order to form a Bayer pattern, the metal optical filters of the green pixels and of the blue pixel comprising aluminum, and the optical filter of the red pixel comprising copper. A better imaging device is thus obtained with notably a better reproduction of the colors by using a Bayer pattern.

Other types of matrix may be formed according to the method defined hereinbefore by integrating for example infrared or UV pixels.

According to another aspect, an integrated imaging device with front face illumination is provided comprising at least a first photosensitive region in a substrate, the device comprising: a first lower dielectric region on top of the front face of the substrate and of the first photosensitive region, the first lower dielectric region having an upper face, at least a first metal optical filter comprising a metal pattern on top of the first photosensitive region, the said filter being on the said upper face or extending into the first lower dielectric region from the said upper face, and a first upper dielectric region on top of the first lower dielectric region and of the first metal optical filter forming with at least a part of the first lower dielectric region a first dielectric region associated with one metallization level of the integrated imaging device, the said upper face of the first lower dielectric region being contained within the said first dielectric region.

The device can comprise a second metal optical filter on top of a second photosensitive region disposed in the substrate and distinct from the first photosensitive region.

The first metal optical filter can comprise a first metal, the second metal optical filter can comprise a second metal different from the first metal, the upper face of the first lower dielectric region associated with the first metal optical filter being contained within a plan distinct of the plan containing the upper face of a second lower dielectric region associated with the second metal optical filter.

The upper face of the first lower dielectric region and the upper face of the second lower dielectric region can be contained in the same dielectric region associated with the same metallization level.

The first metal can be copper and the second metal can be aluminum.

The device can comprise at least four metal optical filters forming a Bayer pattern, the metal optical filters of the green pixels and of the blue pixel comprising aluminum, and the red optical filter comprising copper. The device can furthermore comprise any other type of pixels of other colors, infrared or UV, depending on the desired application.

BRIEF DESCRIPTION OF THE DRAWINGS

Other advantages and features of the invention will become apparent upon studying the detailed description of some embodiments and their implementation, taken by way of non-limiting examples and illustrated by the appended drawings in which.

DETAILED DESCRIPTION OF THE DRAWINGS

Figure 1:
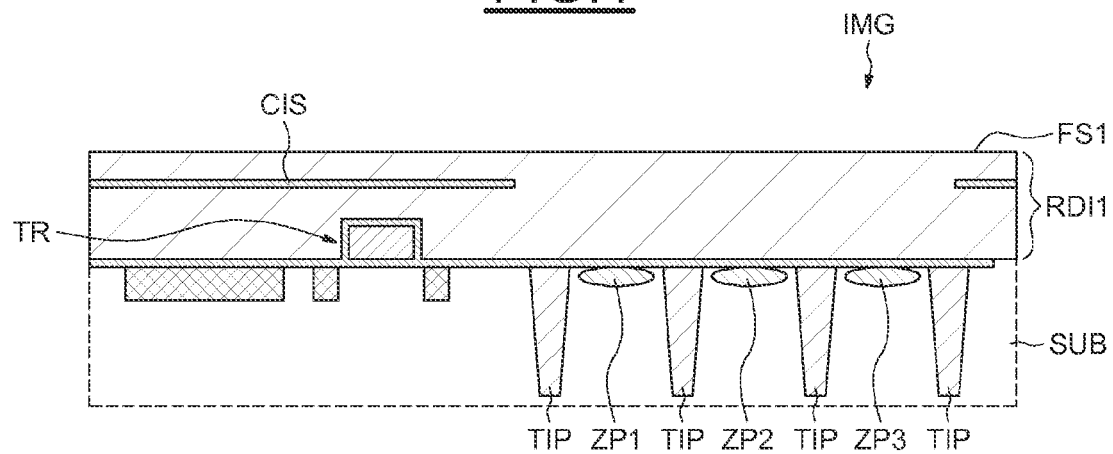
FIGS. 1 to 7 illustrate schematically various steps of a method for fabricating an imaging device.

FIG. 1 shows an imaging device IMG having a substrate SUB in which photosensitive regions ZP1, ZP2 and ZP3 have been formed. Each photosensitive region ZP1, ZP2 or ZP3 can correspond to a photosensitive region of a pixel and can for example be a photodiode, and the imaging device IMG can be of the CMOS type.

In order to bound the photosensitive regions ZP1, ZP2 and ZP3, deep trench isolation (DTI) features TIP have been formed in the substrate.

Transistors TR, here of the MOS type, have also been formed on the substrate SUB.

In order to form a first metal optical filter (of the plasmonic type), a first lower dielectric region RDI1 has been formed on top of the front face of the substrate SUB and at least of the first photosensitive region ZP1. The first lower dielectric region has an upper face FS1 starting from which the first metal optical filter will be formed.

The formation of the first lower dielectric region RDI1 notably comprises the formation of insulating layers CIS, for example used for the later formation of tracks of metallization levels. These insulating layers CIS can comprise silicon nitride or silicon carbo-nitride and are formed by deposition steps.

The insulating layers CIS do not extend over the photosensitive regions ZP1, ZP2 and ZP3 in order to obtain better optical properties.

It may be noted that the first lower dielectric region RDI1 here corresponds to a portion of a region of pre-metal dielectric (PMD).

Figure 2:
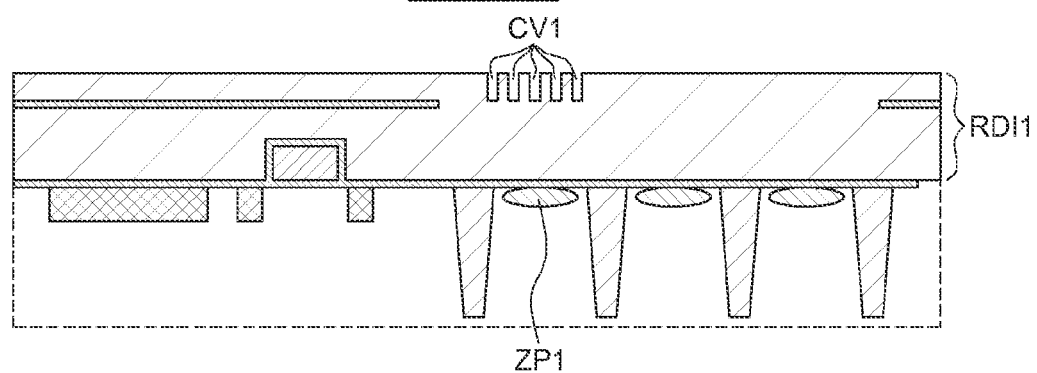

In order to form a copper filter, well adapted for filtering the color red, cavities CV1 are formed bounding a periodic pattern in the first lower dielectric region RDI1 on top of the photosensitive region ZP1 (FIG. 2). The cavities CV1 have geometrical properties (lateral and depth dimensions) which are linked to the wavelength to be filtered. Those skilled in the art will know how to choose these geometrical properties according to this wavelength to be filtered. By way of example, the depth of the cavities CV1 (which will be the height of the first filter) can be in the range between 25 and 200 nanometers, which is much smaller than the thickness of a metallization level (typically a few hundreds of nanometers to a few micrometers).

Figure 3:
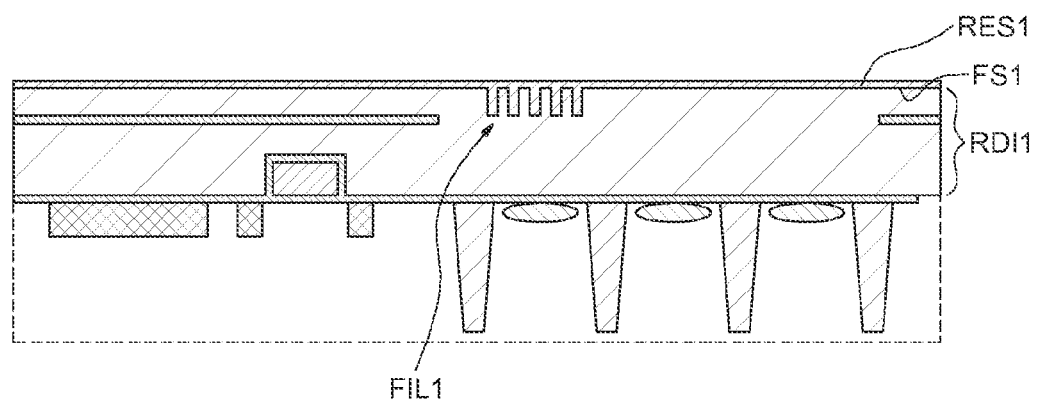

The cavities CV1 are subsequently filled with copper, as illustrated in FIG. 3. A first filter FIL1 is thus obtained in the filled cavities, which has a metal pattern corresponding to that bounded by the cavities CV1 described with reference to FIG. 2. This filling with copper can be implemented by a physical vapor deposition (or PVD) process, and a first residual layer of copper RES1 can subsist after the filling on the upper face FS1 of the first lower dielectric region RDI1.

It may be noted that, in contrast to the filters according to the prior art, and notably to the filters described in the document US 2003/0103150, it is not necessary to implement a method analogous to that used to form a track of a metallization level which comprises the formation of cavities, the formation of barriers comprising tantalum and tantalum nitride, and filling with copper. Indeed, since the method of formation of the metal filters according to one aspect herein is not implemented at the same time as the formation of the metallization levels, it is advantageously possible not to use barrier layers which can be detrimental to the optical properties of the filters.

No electromigration of the copper into the dielectric regions occurs here, since the metal optical filters are not biased. Furthermore, a small amount of diffusion of the copper due to the thermal budget of the steps likely to occur following the formation of the filter would have no impact on the optical performance of this filter.

Figure 4:
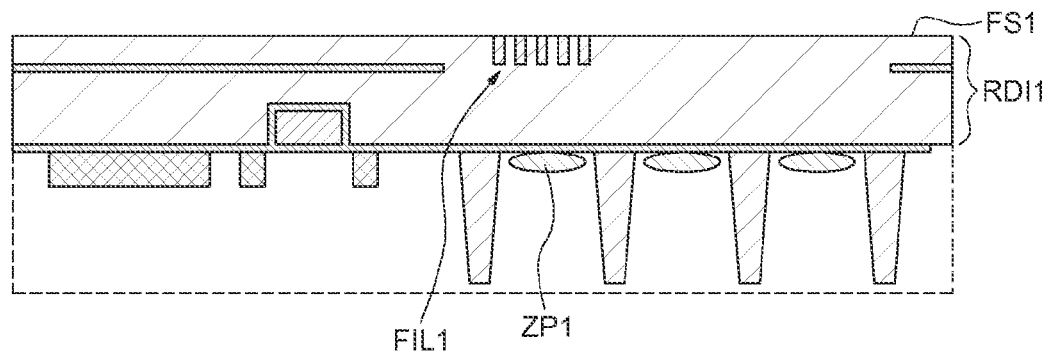

The first residual layer REST of copper can be removed (FIG. 4). The upper face FS1 of the first lower dielectric region is thus opened up and a first filter FIL1 is left remaining on top of a first photosensitive region ZP1 which extends into the first lower dielectric region from its upper face FS1.

Figure 5:
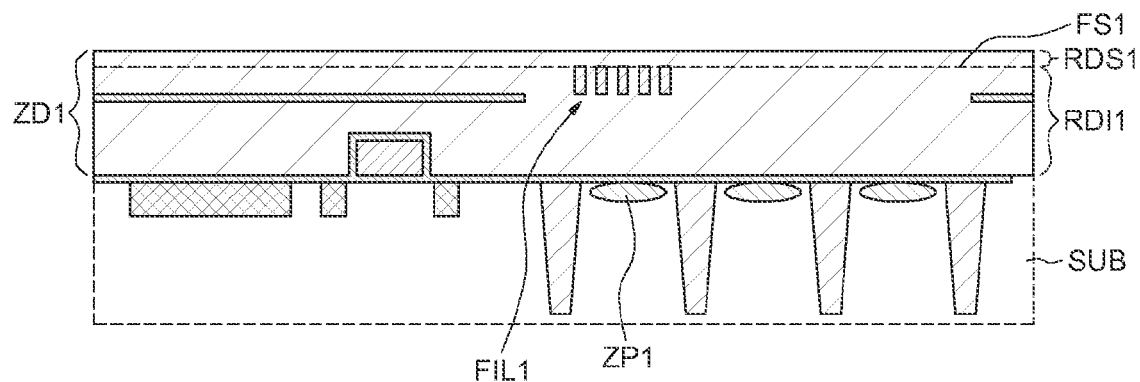

As illustrated in FIG. 5, a first upper dielectric region RDS1 is subsequently formed on top of the first lower dielectric region RDI1 and of the first metal optical filter FIL1 so as to form, with at least a part of the first lower region, a first dielectric region ZD1 associated with one metallization level of the integrated imaging device formed later on, the upper face FS1 of the first lower dielectric region being contained within the said first dielectric region.

An integrated imaging device IMG with front face illumination is accordingly obtained comprising at least a first photosensitive region ZP1 in a substrate SUB, the device comprising: a first lower dielectric region RDI1 on top of the front face of the substrate and of the first photosensitive region, the first lower dielectric region having an upper face FS1, at least a first metal optical filter FIL1 comprising a metal pattern on top of the first photosensitive region, the said filter extending into the first lower dielectric region, and a first upper dielectric region RDS1 on top of the first lower dielectric region and of the first metal optical filter forming, with at least a part of the first lower dielectric region, a first dielectric region ZD1 associated with one metallization level of the integrated imaging device, the said upper face of the first lower dielectric region being contained within the said first dielectric region.

Figure 6:
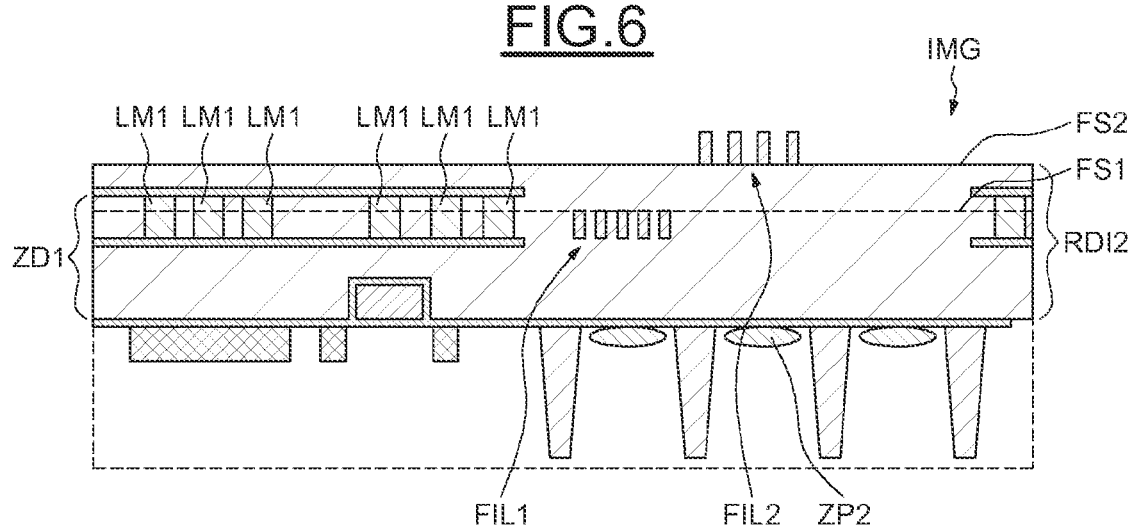

In FIG. 6, the imaging device IMG is shown after the formation of a metallization level comprising tracks LM1, here the first metallization level of the imaging device IMG. The first metallization level is associated with the first dielectric region ZD1 which corresponds to a region of pre-metal dielectric.

It may be noted that the presence of the first filter FIL1 does not interfere at all with the formation of the metal tracks LM1 which are formed on the upper face of the first dielectric region ZD1.

A portion of inter-metallic dielectric has also been formed in order to obtain a second lower dielectric region RDI2 having an upper face FS2 contained in a separate plane of the upper face FS1 described hereinbefore.

On the upper face FS2, a second metal filter FIL2 has been formed on top of the region ZP2, here made of aluminum and hence well adapted for filtering the colors blue and green.

Figure 7:
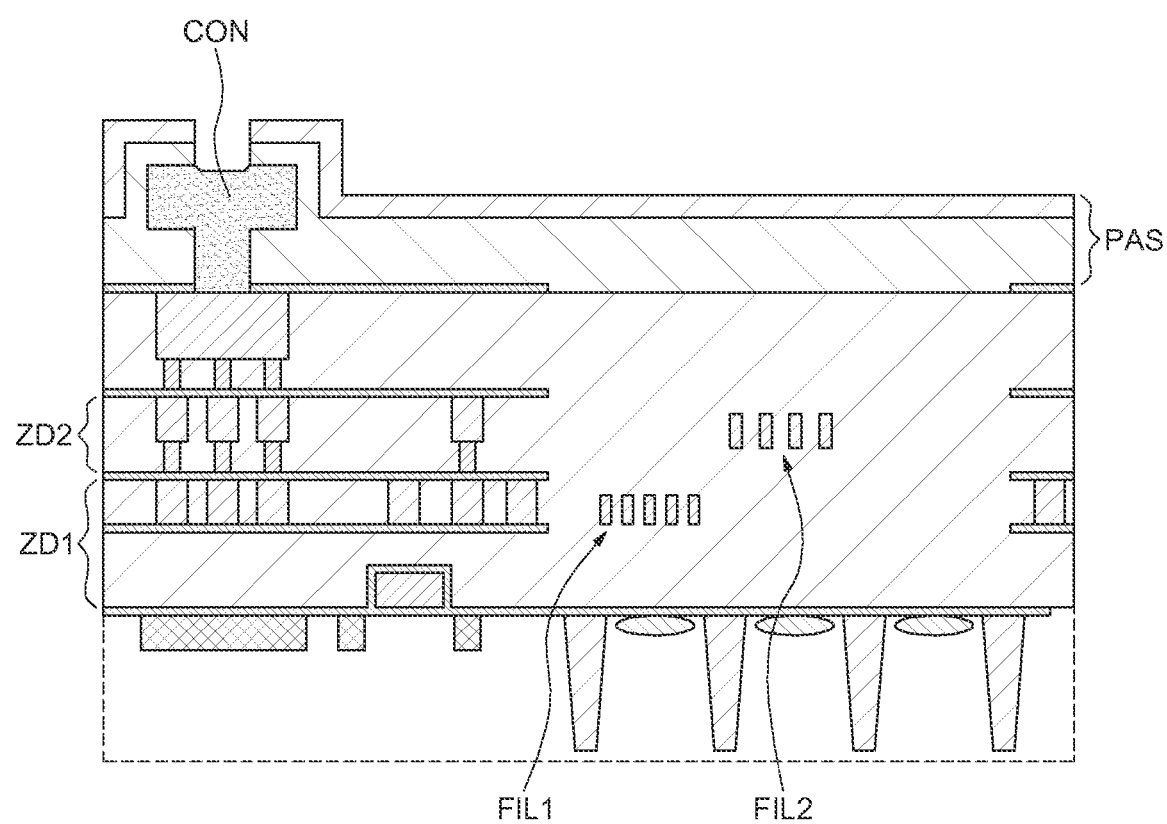

In FIG. 7, the integrated imaging device IMG is shown after a certain number of fabrication steps.

More precisely, the following have been formed: a second metallization level associated with a second dielectric region ZD2 of the second metal filter FIL2, a third metallization level and a connection to the outside CON of the "pad" type and passivation layers PAS.

It may be noted that the second dielectric region ZD2 corresponds here to the region of inter-metallic dielectric associated with the second metallization level.

Furthermore, in the prior art, the filters using pigments are disposed on top of the integrated imaging device, which leads to a poor operation associated with the "cross-talk". Here, the filters FIL1 and FIL2 are disposed much lower down. Such is in particular the case for the filter FIL1 which is disposed within the dielectric region ZD1 which corresponds to the pre-metal dielectric, which is not possible with the solutions of the prior art.

According to one aspect, the embodiments are not limited to the filters disposed within separate dielectric regions. It is possible to form filters at different heights within the same dielectric region associated with one metallization level. It is also possible to form a larger number of different filters within the same integrated imaging device, for example in order to form Bayer patterns.

According to another aspect, metal optical filters, or plasmonic filters, comprising metal patterns with dimensions the best adapted for the wavelengths to be filtered, are more easily obtained.

Lastly, according to yet another aspect, better optical properties are obtained, since the metal filters can be formed directly within the dielectric regions without any additional layers.

What is claimed is:

1. A method for fabricating an integrated imaging device with front face illumination, comprising:
    forming a first lower dielectric region on top of a front face of a substrate including a first photosensitive region of a pixel, the first lower dielectric region having a first upper face,
    forming a first metal optical filter comprising a metal pattern above the first photosensitive region, said first metal filter positioned in trenches extending into the first lower dielectric region from said first upper face,
    forming a first upper dielectric region on top of the first lower dielectric region and on top of an upper surface of the first metal optical filter so as to form, with at least a part of the first lower dielectric region, a first dielectric region having a second upper face, and
    forming metal lines associated with a lowest metallization level of the integrated imaging device positioned extending into the first upper dielectric region from said second upper face,
    wherein said first upper face of the first lower dielectric region and upper surface of the first metal optical filter are positioned closer to the front face of the substrate than said second upper face of said first upper dielectric region.

2. The method according to claim 1, further comprising forming a second metal optical filter above a second photosensitive region distinct from the first photosensitive region.

3. The method according to claim 2, wherein the upper face of the first lower dielectric region associated with the first metal optical filter is contained within a plane distinct from the plane containing the upper face of a second lower dielectric region associated with the second metal optical filter.

4. A method for fabricating an integrated imaging device with front face illumination, comprising:
    forming a first lower dielectric region on top of a front face of a substrate including a first photosensitive region of a pixel, the first lower dielectric region having an upper face,
    forming a first metal optical filter comprising a metal pattern above the first photosensitive region, said first metal filter positioned on said upper face or extending into the first lower dielectric region from said upper face, and
    forming a first upper dielectric region on top of the first lower dielectric region and on top of the first metal optical filter so as to form, with at least a part of the first lower dielectric region, a first dielectric region associated with one metallization level of the integrated imaging device, wherein said upper face of the first lower dielectric region is contained within the said first dielectric region; and
    forming a second metal optical filter above a second photosensitive region distinct from the first photosensitive region;
    wherein the first metal optical filter is formed with a first metal, the second metal optical filter is formed with a second metal different from the first metal, the upper face of the first lower dielectric region associated with the first metal optical filter being contained within a plane distinct from the plane containing the upper face of a second lower dielectric region associated with the second metal optical filter.

5. The method according to claim 4, wherein the upper face of the first lower dielectric region and the upper face of the second lower dielectric region are contained in the same dielectric region associated with the same metallization level.

6. The method according to claim 4, wherein the first metal is copper and the second metal is aluminum.

7. The method according to claim 6, wherein at least four metal optical filters are formed in order to form a Bayer pattern, the metal optical filters of green and blue pixels comprising aluminum, and the metal optical filter of the red pixel comprising copper.

8. An integrated imaging device with front face illumination, comprising:
    a first photosensitive region in a substrate,
    a first lower dielectric region on top of a front face of the substrate and of the first photosensitive region, the first lower dielectric region having a first upper face,
    at least a first metal optical filter comprising a metal pattern above the first photosensitive region, said first metal optical filter positioned in trenches extending into the first lower dielectric region from said first upper face, and
    a first upper dielectric region on top of the first lower dielectric region and on top of an upper surface of the first metal optical filter forming, with at least a part of the first lower dielectric region, a first dielectric region having a second upper face, and
    metal lines associated with a lowest metallization level of the integrated imaging device positioned extending into the first upper dielectric region from said second upper face,
    wherein said first upper face of the first lower dielectric region and upper surface of the metal optical filter are positioned closer to the front face of the substrate than said second upper face of said first upper dielectric region.

9. The device according to claim 8, further comprising a second metal optical filter above a second photosensitive region disposed in the substrate and distinct from the first photosensitive region.

10. The device according to claim 9, wherein the upper face of the first lower dielectric region associated with the first metal optical filter is contained within a plane distinct from the plane containing the upper face of a second lower dielectric region associated with the second metal optical filter.

11. The device according to claim 9, wherein the upper face of the first lower dielectric region and the upper face of the second lower dielectric region are contained within the same dielectric region associated with the same metallization level.

12. An integrated imaging device with front face illumination, comprising:
    at least a first photosensitive region in a substrate,
    a first lower dielectric region on top of a front face of the substrate and of the first photosensitive region, the first lower dielectric region having an upper face,
    at least a first metal optical filter comprising a metal pattern above the first photosensitive region, said first metal optical filter positioned on said upper face or extending into the first lower dielectric region from said upper face, and a first upper dielectric region on top of the first lower dielectric region and on top of the first metal optical filter forming, with at least a part of the first lower dielectric region, a first dielectric region associated with one metallization level of the integrated imaging device, said upper face of the first lower dielectric region being contained within said first dielectric region;

a second metal optical filter above a second photosensitive region disposed in the substrate and distinct from the first photosensitive region;

wherein the first metal optical filter comprises a first metal, the second metal optical filter comprises a second metal different from the first metal, the upper face of the first lower dielectric region associated with the first metal optical filter being contained within a plane distinct from the plane containing the upper face of a second lower dielectric region associated with the second metal optical filter.

13. The device according to claim 12, wherein the first metal is copper and the second metal is aluminum.

14. The device according to claim 13, further comprising at least four metal optical filters forming a Bayer pattern, the metal optical filters of the green and blue pixels comprising aluminum, and the metal optical filter of the red pixel comprising copper.

15. A device, comprising:
a semiconductor substrate;
a first photosensitive region formed in the semiconductor substrate;
a first dielectric layer over a top surface of the semiconductor substrate, the first dielectric layer having a first upper surface;
a plurality of trenches in the first upper surface of the first dielectric layer positioned above the first photosensitive region;
a first metal material filling the plurality of trenches to form a first metal optical filter having an upper surface coplanar with said first upper surface of the first dielectric layer;
a second dielectric layer on the first upper surface, said second dielectric layer having a second upper surface positioned above the first upper surface and the first metal optical filter; and
a metal line of a lowest metallization layer positioned extending into the second dielectric layer from said second upper face and further extending into the first upper surface of the first dielectric layer.

16. The device of claim 15, wherein the first metallization layer has a second upper surface, further comprising:
a second photosensitive region formed in the semiconductor substrate; and
a plurality of metal structures formed of a second metal material on the second upper surface positioned above the second photosensitive region to form a second metal optical filter.

17. A device, comprising:
a semiconductor substrate;
a first photosensitive region formed in the semiconductor substrate;
a second photosensitive region formed in the semiconductor substrate;
a pre-metal dielectric layer over a top surface of the semiconductor substrate, the pre-metal dielectric layer having a first upper surface;
a plurality of trenches in the first upper surface of the pre-metal dielectric layer positioned above the first photosensitive region;
a first metal material filling the plurality of trenches to form a first metal optical filter;
a first metallization layer over the first upper surface, wherein the first metallization layer has a second upper surface; and
a plurality of metal structures formed of a second metal material on the second upper surface positioned above the second photosensitive region to form a second metal optical filter.

18. The device of claim 17, wherein the first metal material is copper and the second metal material is aluminum.

19. The device of claim 17, wherein the first metal material is selected from the group consisting of aluminum and copper.

* * * * *